INVENTOR.
Sarkis M. Douaihy
BY
Willman and Jacobs
ATTORNEY.

Nov. 21, 1967 S. M. DOUAIHY 3,354,323
PULSE GENERATOR WITH DIRECT CONNECTION TO OUTPUT
PULSE FORMER AND TIME DELAY IN BRANCH CIRCUIT
Filed Nov. 27, 1964 3 Sheets-Sheet 2

INVENTOR.
Sarkis M. Douaihy
BY
Millman and Jacobs
ATTORNEY.

INVENTOR.
Sarkis M. Douaihy
BY
Millman and Jacobs
ATTORNEY.

3,354,323

PULSE GENERATOR WITH DIRECT CONNECTION TO OUTPUT PULSE FORMER AND TIME DELAY IN BRANCH CIRCUIT

Sarkis M. Donaihy, Riverside, N.J., assignor to Computer Test Corporation, a corporation of Pennsylvania Filed Nov. 27, 1964, Ser. No. 414,260
17 Claims. (Cl. 307—88.5)

ABSTRACT OF THE DISCLOSURE

A pulse generator employs a direct connection between input and output transistors and linear-ramp time delay in a branch circuit. Fast rise and fall times are achieved with a broad range of pulse-width variation.

This invention relates generally to pulse generators and particularly to a pulse generator for the generation of pulses of rectangular shape and of a broad range of characteristics including very narrow pulses at high repetition rates.

One form of existing pulse generators is the conventional monostable or one-shot multivibrator; in the latter, the width of the output pulse is a logarithmic function of the RC (resistance-capacitance) time constant which is inserted in series with the regenerative feedback loop customarily provided in such circuits. The use of such a regenerative feedback loop, it has been found, adversely affects the rise and/or fall time of the generated pulses; that is, it becomes extremely difficult to achieve transition time periods of the pulse of the order of a few nanoseconds. It also becomes difficult to achieve recovery or restoration of the circuit in short time periods, such as nanoseconds, so that there are substantial limitations on the repetition rate of the pulses. In addition, where a variable control of the pulse width is desired, the range of variation is ordinarily quite limited. That is, the insertion of the timing network in the regenerative feedback loop has the following disadvantages: If the resistance in the loop is made too large, restoration of the one-shot multivibrator to its stable state is made quite difficult or even impossible to achieve with practical components; if the capacitance is made too large, the recovery time of the circuit becomes very large, thereby decreasing resolution time or recovery of the circuit.

It is an object of this invention to provide a one-shot multivibrator without the aforementioned disadvantages.

Another object of the invention is to provide a new and improved generator of rectangular pulses.

Another object of the invention is to provide a new and improved pulse generator that is adjustable to produce pulses of widths variable over a wide range.

Another object is to provide a new and improved generator of rectangular pulses having a constant amplitude and fast rise and fall time periods.

Another object of the invention is to provide a pulse generator which produces very narrow pulses and which has an extremely short recovery time.

In accordance with an embodiment of this invention, a pulse-forming circuit is used to produce the leading edge of each rectangular output pulse in response to an actuating signal and to produce the trailing edge of each output pulse in response to a signal from a timing circuit, which also responds to the actuating signal and introduces the desired spacing between said leading and trailing edges. The intermediate portion of each output pulse is formed by supplying a constant level signal during the space between the leading and trailing edges.

The foregoing and other objects, the advantages and novel features of this invention, may be best understood from the following description when read in connection with the accompanying drawing, wherein.

In the accompanying drawing, like numerals refer to corresponding parts throughout.

Figure 1:
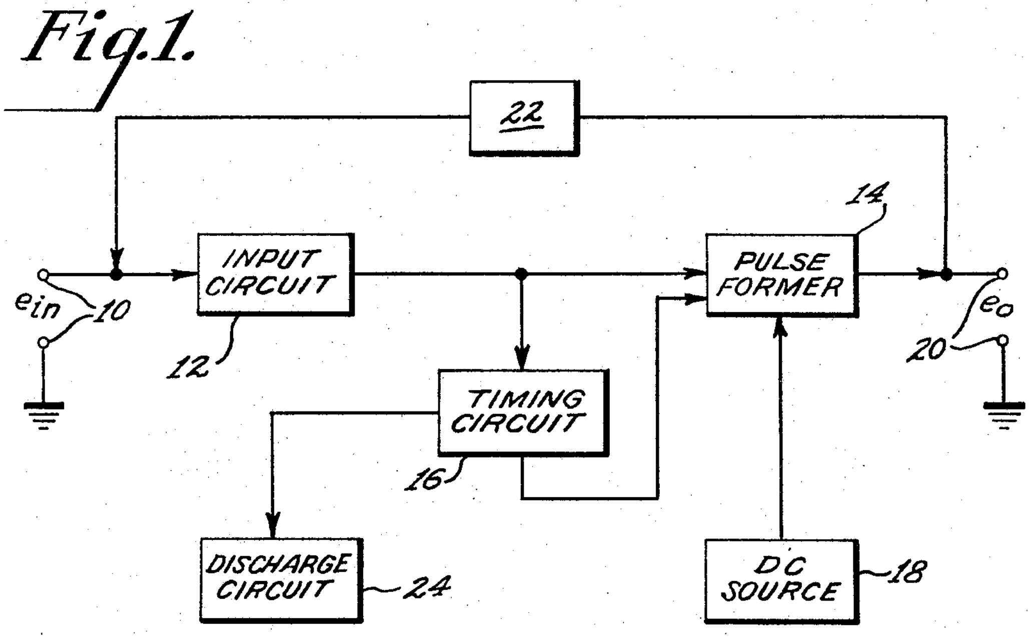
FIG. 1 is a schematic block diagram of a pulse generator embodying this invention.

In the pulse generator of FIG. 1, input pulses ($e_{in}$) at terminals 10 are supplied to an input circuit 12 which, in turn, generates an actuating signal that is supplied to a pulse former 14 and to a timing circuit 16. A direct current (DC) source 18 is connected via the pulse former 14 to the output terminals 20. The DC source supplies either of two constant signal levels to the output terminals 20, depending upon the pulse former 14 being in either of two operating states. The direct current potential which is generated at the output of pulse former 14 is also fed via network 22 back to input circuit 12; thereby, the circuit operates, tending to maintain the pulse former 14 in whatever operating state it assumes.

In the quiescent operating state, pulse former 14 supplies a first signal level from source 18 to the output terminals. The signal fed back via network 22 to the input circuit is such as to maintain this output signal level. Upon receipt of an input pulse, circuit 12 actuates pulse former 14 to generate the leading edge of the output pulse at terminal 20, and the second signal level from source 18 is supplied to that output terminal. The other output level at terminal 20 is fed back via network 22 to the input circuit 12 in a manner to maintain the pulse former 14 in its actuated state. At the same time that pulse former 14 is actuated, the operation of timing circuit 16 is also initiated by the same actuating signal. The timing circuit 16 includes a delay circuit in the form of a reactive or energy-storage network which produces (a preset period after the pulse former 14 has been actuated) a deactivating signal for restoring the pulse former to its quiescent state. At that time, the trailing edge of the output pulse is generated, and the first signal level from source 18 is immediately supplied to the output terminal, as well as back to the input circuit to restore the latter to its quiescent state. The timing circuit 16 is connected to a discharge circuit 24 which is operative at this time to provide a fast discharge path for the energy stored therein so as to restore it quickly to its quiescent state. Thereby, the entire pulse generating circuit recovers very quickly so that a succeeding input pulse can be immediately applied to generate another rectangular output pulse. The operation of the pulse former 14 to its two states is in direct response to the actuating signal from the input circuit and the deactivating signal from timing circuit; there are no regenerative actions produced by the signals fed back via network 22. The latter merely tends to maintain the pulse former in whichever operating state it is driven to by the associated circuits.

Figure 2:
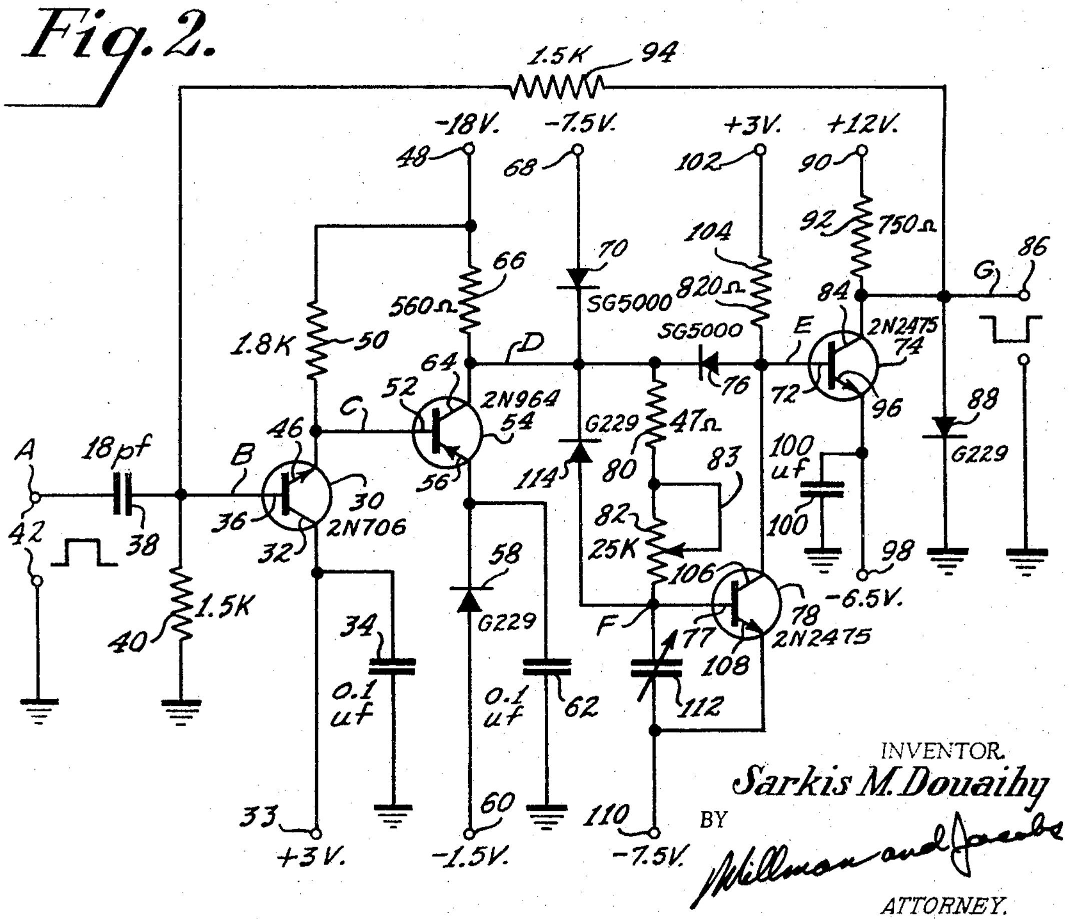
FIG. 2 is a schematic circuit diagram of a pulse generator embodying this invention.

In the specific embodiment of FIG. 2, a suitable set of parameters is set forth in the drawing to illustrate a fully operative embodiment of the invention and for use in the explanation of its operation. This invention is not limited, of course, to any particular set of parameters. An input transistor 30, functioning as an emitter-follower having a high impedance input and a low impedance output, has its collector electrode 32 connected to a positive potential at terminal 33 and also connected via a capacitor 34 to ground. The capacitor 34 is effective to connect the collector of transistor 30 to ground for AC operation (i.e. during transitions from one state to another) and to prevent oscillation due to changes in impedance. A source of input pulses at input terminals 42 is connected to the base electrode 36 of transistor 30 via a differentiating network, comprised of capacitor 38 and resistor 40. The emitter electrode 46 of transistor 30 is connected to a negative potential source at terminal 48 via resistor 50. The emitter electrode 46 is also connected to the base electrode 52 of transistor 54. The transistor 54 has a complementary polarity to that of transistor 30 and has its emitter electrode 56 connected via a diode 58 to a negative potential at terminal 60. It is also connected via capacitor 62 to ground. The capacitor 62 acts as an AC bypass to the impedance of diode 58 to prevent the transistor 54 from acting as an emitter-follower and thereby preventing the degenerative action that otherwise would occur. In the quiescent condition, the voltage at the base of emitter-follower 30 is near ground potential, as is its emitter and base 52 of transistor 54. Thus, the emitter-base path in the latter is normally back-biased, and the transistor is thus normally cut off or nonconducting. The collector 64 is connected via resistor 66 to a negative potential source at terminal 48, via diode 70 to the negative potential source at terminal 68, via diode 76 to the base 72 of transistor 74, and via resistors 80 and 82 to the base 77 of transistor 78. Resistor 82 may be a variable resistor with an adjustable wiper 83, and resistor 80 is of low resistance and is provided to ensure a resistive path between collector electrode 64 and base electrode 78. The collector 64 is held at a negative potential, when transistor 54 is cut off, by the clamping action of diode 70.

Transistor 74 functions as the output pulse former circuit and is of a complementary polarity to transistor 54. The collector 84 is connected to output terminal 86, to ground potential via diode 88 (which serves as a voltage clamp), and to terminal 90 which is at a positive potential via resistor 92. Output terminal 86 is connected back to the base 36 of transistor 30 via resistor 94. Emitter 96 is connected to a negative potential at terminal 98, and to ground via capacitor 100, which acts as an AC bypass to ground. The base-emitter path of transistor 74 is normally reverse-biased due to the more negative voltage at the base established by clamping diode 70.

The emitter 108 of transistor 78 is connected to a negative potential at terminal 110. A capacitor 112 is connected between the base 77 and terminal 110, and the capacitor 112 and the resistors 80 and 82 together form an integrating network which determines the time delay of the circuit. The emitter-base path of transistor 78 is normally back-biased due to the base of transistor 78 being more negatively biased, as determined by clamping diode 70. The base 77 is also connected to a diode 114 which is in turn connected via resistor 66 to terminal 48. Diode 114 and resistor 66 form a low impedance discharge path for the capacitor 112.

Figure 3:
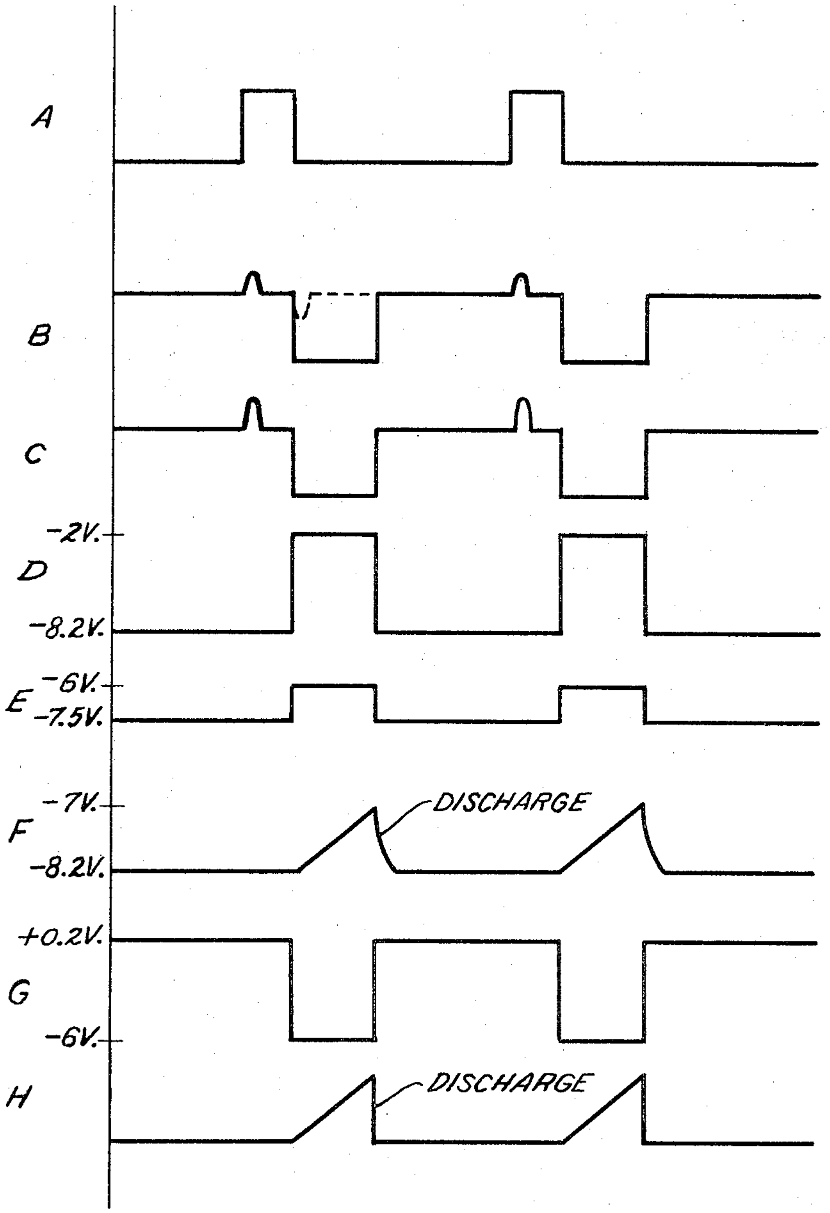
FIG. 3 is an idealized graph of signals occurring at various reference portions of the circuit of FIG. 2.

A description of the operation of the circuit in FIG. 2 proceeds in conjunction with the waveform diagram of FIG. 3. The approximate operating voltages at the points in FIG. 2 labeled A through G are shown on lines A through G, respectively, in FIG. 3. For instance, the input voltage to the circuit as seen at point A of FIG. 2 is shown on line A of FIG. 3. The range of voltages is of course only exemplary for the illustrated circuit parameters, and the invention is not limited to any particular range.

In the quiescent state of the circuit, transistors 54, 74 and 78 are back-biased and cut off, as explained above. The output terminal 86 is clamped approximately at ground (actually, about +0.2 v.), and input transistor 30 operates as an emitter-follower with its base and emitter both at approximately ground.

The operation is first described with respect to a positive-going input pulse. Such a pulse at terminal 42 is differentiated by the network comprised of capacitor 38 and resistor 40 and appears at point B as a positive-going pulse at the leading edge of the input pulse and, as seen in the dotted line on line B of FIG. 3, as a negative pulse at the trailing edge of an input pulse. However, as is explained hereinafter, the voltage fed back via the resistor 94 causes the voltage at point B at the base of transistor 30 to remain negative until the output voltage of transistor 74 goes high again. As seen on line C of FIG. 3, the emitter voltage of transistor 30 follows the input voltage at the base thereof. A positive-going pulse at emitter 46 merely drives transistor 54 further into the cut-off region. Diode 58 in the emitter circuit of the transistor 54 is provided in order to protect the emitter-base junction of transistor 54 from breakdown when excessively back-biased. However, an emplified negative pulse at emitter electrode 46, generated at the trailing edge of the input pulse, drives transistor 54 into the saturation region as the emitter-base junction thereof is forward-biased. The saturation current is provided via resistor 50, and as the current in resistor 50 decreases, the deficiency is made up by the current from the emitter of transistor 30.

The saturation of transistor 54 causes the voltage at collector electrode 64 to rise, for the illustrated parameters, from about −8.2 volts to approximately −2 volts (line D of FIG. 3). The rise of voltage at point D is followed by a rise of voltage at the base 72 (line E, FIG. 3) of transistor 74 until the voltage rises above the −6.5 volts at the emitter 96, thereby forward-biasing the emitter-base junction of transistor 74 and driving the latter into saturation, with base current being supplied from the positive potenital source at terminal 102 via resistor 104. The collector voltage of transistor 74 thus falls from +0.2 volt clamp voltage towards the DC voltage potential of −6.5 volts supplied at terminal 98. Because the collector voltage is clamped to this source as long as the transistor 74 remains saturated, a highly stable voltage is generated at the output terminal 86. The negative collector voltage at transistor 74 is also fed back via resistor 94 to the base 36 of transistor 30 which is, in turn, applied to the base of transistor 54, thereby preventing cut-off of the transistor 54. The transistor 54 is thus maintained saturated until the collector voltage of transistor 74 rises to its quiescent voltage of +0.2 volt, and therefore, it remains saturated for the duration of the output pulse.

The saturation of transistor 74 also clamps the voltage at the base 72 to the voltage necessary to forward-bias the emitter-base junction. However, as the voltage at collector 64 continues to rise above the voltage at base 72, diode 76 becomes back-biased, thereby isolating the base 72 of transistor 74 from the collector 64 of transistor 54, so that the impedance at each one is precluded from affecting the current path of the other once transistor 74 is driven into the active state and until it is thereafter cut off. The initial rise in voltage at the collector 64 of transistor 54 also causes the voltage (line F, FIG. 3) at the base 77 of transistor 78 to rise. This rise in voltage is in accordance with the time constant of the integrating network which is equal to the product of the resistance of resistors 80 and 82 and the capacitance of capacitor 112.

When the emitter-base junction of transistor 78 becomes forward-biased, the transistor is driven into saturation, and the collector voltage drops sharply towards its emitter potential of −7.5 volts. This action reverse-biases transistor 74 and diverts the current supplied by resistor 104 away from the base 72, thereby cutting off transistor 74. The output at collector 84 goes high again, and the trailing edge of the output pulse is generated. The voltage fed back via resistor 94 restores the transistor 30 to its quiescent condition which, in turn, cuts off transistor 54. The consequent restoration of the low voltage at the collector electrode 64 forward-biases diode 114 and initiates the discharge of capacitor 112 through the low impedance path provided by diode 114 and resistor 66. Since capacitor 112 is discharged quickly through the low impedance path, the voltage at the base of transistor 78 also falls off very quickly, and the transistor is thereby cut off by the back-biasing of its emitter-base junction. The voltage at the base of transistor 78 is illustrated on line F of FIG. 3. In order to more clearly show the discharge voltage, the "discharge" portion of the curve is exaggerated and is actually much shorter in time with respect to the remainder of the sawtooth pulse. Thus, transistor 78 initiates the action of cutting off the pulse former 74, and the resulting feedback voltage produces the action of cutting off transistor 78. Thus, the entire pulse generator is restored to its quiescent condition very quickly which enables the circuit to be ready in a very short time to accept the next triggering input pulse. The process is then repeated in the manner described above.

Thus, a well-formed output pulse is generated in response to an input pulse without the requirement of additional pulse shaping circuitry. The input circuit comprised of transistors 30 and 54 are so constructed that it is sensitive enough to be triggered by input pulses in the low voltage range. Pulse widths in the nanosecond range may be generated as well as very large pulse widths of the order of a second without affecting the rise and fall times at the edges of the pulse. This is possible because the delay or timing network is not directly involved in the saturation or the cut-off of the pulse former transistor 74. That is, due to the direct coupling of the circuit without series reactances, transistor 54 drives pulse former 74 directly into saturation, and transistor 78, when it is saturated, drives pulse former 74 into cut-off without interaction from the time delay network. Further, because the discharge path operates essentially independently of the operation of the circuitry for saturating and cutting off the pulse former, the circuit recovers in a very short time to receive the next input pulse. Fast rise and fall times of the generated pulses is attained by the use of direct coupling throughout the actuating and deactivating paths of the pulse generator. That is, this pulse generator eliminates from the pulse-forming portions of the circuitry reactive couplings that need to be charged and discharged; the reactive time-delay network is in a shunt path and does not affect the pulse-forming action. The diode 76, which is back-biased when transistor 74 is saturated, isolates transistor 74 from transistor 54, thereby removing the low impedance output of transistor 54 from the output circuit. Accordingly, transistor 54 does not interfere with the action of transistor 78 in cutting off the pulse former 74. This diode 76 also isolates any effect of the pulse former 76 on the voltage at the collector of transistor 54, which is used to charge the integrating network; thereby, a uniform charging voltage is ensured, and uniform pulse widths are obtained.

The integrating capacitor is fed from a constant current source through the combination of resistors 80 and 82. A very small linear voltage ramp of constant slope corresponding to the initial portion of the logarithmic curve is used to determine the time delay and, thereby, the width of the output pulse. This linearity permits a wide range of adjustment of the pulse width that can be obtained. The adjustment of variable resistor 82 controls the pulse width; and adjustment of variable capacitor 112 controls the range of pulse width within which the width is varied. With the parameters of the circuit of FIG. 2, the circuit is capable of a pulse width range of 250:1 without requiring a large RC product. This linearity in the voltage variation that controls the turning on and saturation of transistor 78 ensures that the operation is well-defined and precisely controllable. Consequently, the cut-off of pulse former 74 is similarly well-defined, and jitter and hesitancy in the trailing edge of the pulse are eliminated.

The use of complementary transistors in adjacent stages (N-P-N, P-N-P, and N-P-N for transistors 30, 54, and 74, respectively) results in a great reduction in the power consumption and consequently, the heat dissipated internally of the circuit. Also, by not using the feedback loop as an active element in the circuit for saturating or cutting off the output pulse-forming transistor, variations in the parameters due to temperature, humidity, or aging do not affect stability or performance of the circuit.

Figure 4:
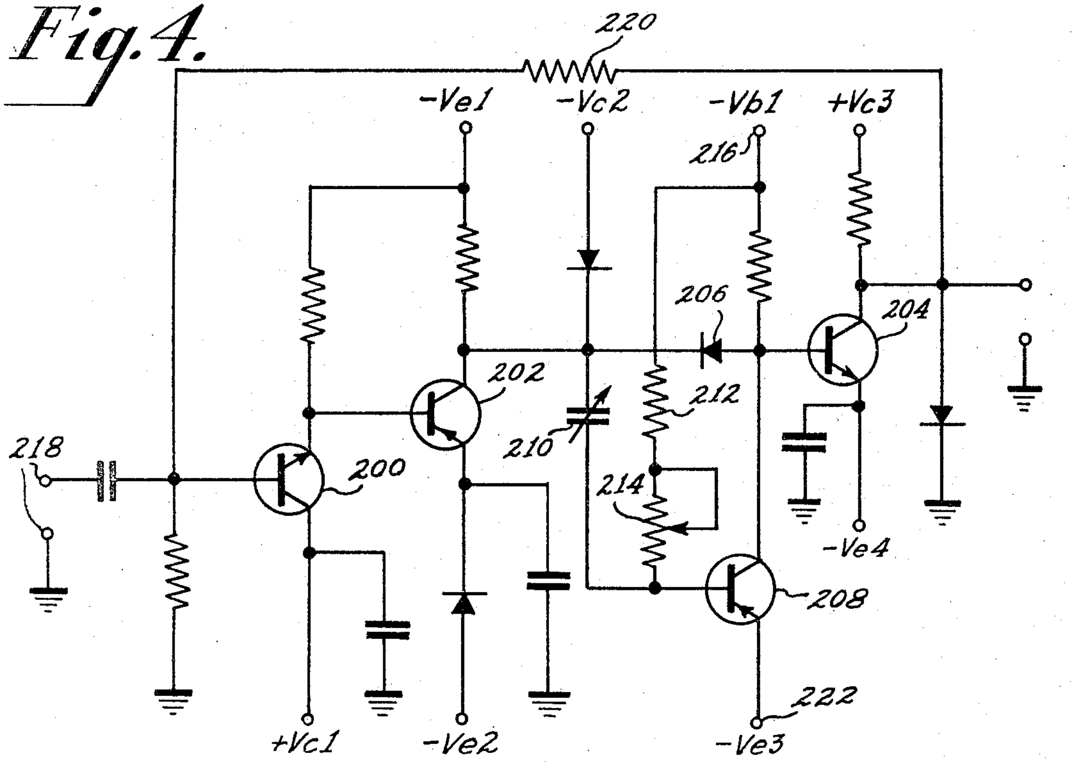
FIG. 4 is a schematic circuit diagram of another form of the invention with a modified timing circuit.

The pulse generator may be modified as shown in FIG. 4, where it is desired to use a differentiating circuit for the time delay which produces the pulse width. Transistors 200 and 202 and their associated circuitry are connected in a manner similar to transistors 30 and 54 in FIG. 2 and are operated in a substantially similar manner. The collector of transistor 202 is connected to the base of transistor 204 via a diode 206 as in the embodiment of FIG. 2. However, the collector of transistor 202 is connected to the base electrode of transistor 208 via series capacitor 210. It should be noted that transistor 208 is a P-N-P type as opposed to the N-P-N type of transistor 78 which is used in the timing circuit of the FIG. 2 embodiment. Also, the resistive portion of the timing circuit comprised of resistors 212 and 214 in series is connected between the base electrode of transistor 208 and a negative voltage potential $-Vb1$ at terminal 216. Thus, except for the time delay network, the general circuit configuration of FIG. 4 is the same as that of FIG. 2.

In the quiescent condition, transistors 202 and 204 are cut off, and transistor 208 is normally conducting (its collector voltage is determined by diode 206 and $-Vc2$; its emitter voltage $-Ve3$ thereby is chosen to be less negative than $-Vb1$).

In operation, the receipt of a pulse at terminal 218 results in transistor 200 saturating transistor 202 which, in turn, causes a rise in voltage at the collector thereof. As the voltage at the collector of 202 rises to the voltage of $-Ve2$, the voltage at the base of transistor 208 (at the other terminal of the capacitor) also rises immediately, thereby back-biasing the emitter-base junction of transistor 208 and cutting it off. This same rise in voltage at the collector of transistor 202 enables the emitter-base junction of transistor 204 to be forward-biased, thereby saturating transistor 204 which generates the leading edge of an output pulse at its collector in a manner similar to that of the circuit of FIG. 2. The voltage at the collector of transistor 204 is fed via resistor 220 to the base of transistor 200 to hold transistor 202 in saturation. When the voltage at the collector of transistor 202 levels off near the emitter voltage, $-Ve2$, the capacitor voltage at the base of transistor 208 starts to decrease towards the voltage $-Vb1$ at terminal 216.

When the voltage at the base of transistor 208 decays to a value more negative than the negative potential $-Ve3$ at terminal 222, the emitter-base junction of transistor 208 becomes forward-biased. Transistor 208 is driven to saturation, thereby diverting the current from the base of transistor 204 and cutting it off, which action produces the trailing edge of the output pulse. The collector voltage from transistor 204 is fed back through resistor 220 to the base of transistor 200 which, in turn, cuts off transistor 202 and enables the circuit to be responsive to the next input pulse.

Figure 5:
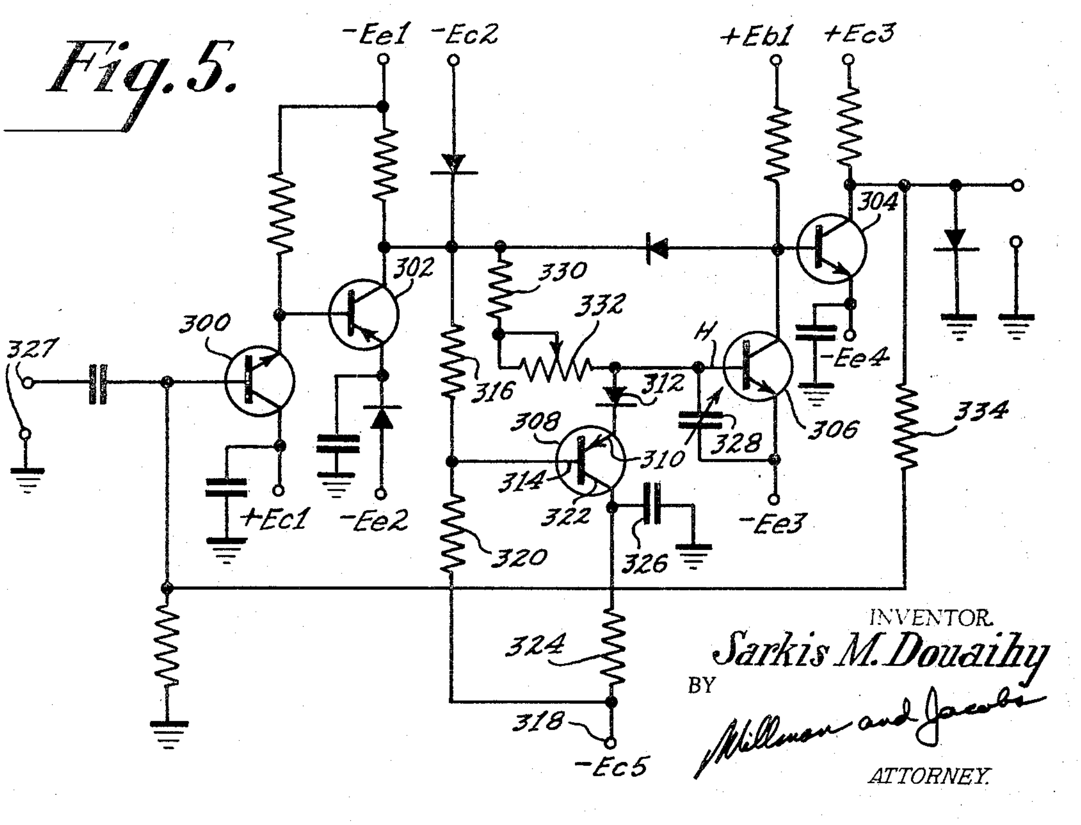
FIG. 5 is a schematic circuit diagram of another form of the invention with a modified discharge circuit.

As discussed hereinbefore, the discharge time of capacitor 112 in the embodiment of FIG. 2 is small, but in some instances may nevertheless be significant. To further reduce the discharge time, a modified discharge circuit as shown in FIG. 5 may be used. The transistors 300, 302, 304 and 306 and their associated circuitry are connected and operate in substantially the same manner as the transistors 30, 54, 74, and 78, respectively, in FIG. 2. A fifth transistor 308, connected in an emitter-follower configuration, has its emitter 310 connected via diode 312 to the base of transistor 306. The base 314 of transistor 308 is connected to the collector of transistor 302 via a resistor 316 and to the terminal 318 which is at a potential of $-Ec5$ via resistor 320. The collector electrode 322 of transistor 308 is connected via resistor 324 to terminal 318 and is also connected to ground via a capacitor 326. The resistors 316 and 320 act as a voltage divider which bias the base electrode 314 of transistor 308 to a potential more negative than that at the emitter 310. This forward-biases the emitter-base junction of transistor 308, thereby rendering the transistor conductive during the quiescent state of the circuit. In other respects, the circuit configuration of FIG. 5 is the same as that of FIG. 2.

In operation, after an input pulse at terminals 327 causes transistor 302 to be turned on, the rise of voltage at the collector of transistor 302 cuts off the transistor 308; that is, its base voltage immediately increases and is made less negative than the emitter voltage, which is the slow-changing capacitor voltage. The integrating network comprised of capacitor 328 and resistors 330 and 332 determine the rise in voltage at the base of transistor 306, in the manner described above with respect to FIG. 2. The rise of voltage at the base of transistor 306 is shown on line H of FIG. 3. When the voltage at the base of transistor 306 rises above the potential $-Ee3$ at the emitter of transistor 306, transistor 306 is turned on and driven to saturation, thereby cutting off the transistor 304 as current is diverted away from the base electrode thereof. The collector voltage of transistor 304 rises and is fed back through resistor 334, thereby cutting off transistor 302. As transistor 302 is cut off, its collector voltage drops sharply, thereby turning on transistor 308. The transistor 308, operating as an emitter-follower, provides a very low emitter impedance for the discharge path, and the capacitor 328 discharges very sharply as shown on line H of FIG. 3. Resistor 324 is provided to limit the current drawn through transistor 308. Thus, a very quick discharge is enabled by means of the discharge circuit including transistor 308 which enables the pulse generating circuit to recover in an extremely small period of time.

The input circuit of transistors 30 and 54 is adapted to accept input pulses of either polarity and to initiate the generation of a pulse on the negative-going voltage step of the input pulse whether it be at the trailing edge (as described above) or at the leading edge. If at the leading edge, the operation proceeds in the manner described above; and the subsequent positive-going step at the trailing edge has no substantial effect on the circuit since the signal fed back by resistor 94 is sufficiently negative (except for an unusually high amplitude input pulse) to maintain transistor 54 in the saturated state. In the case of high input pulses, a suitable feedback current can be provided to compensate therefor.

The input circuit of transistors 30 and 56 is sensitive to very small signals and effective therewith to initiate the generation of a rectangular pulse, whose waveshape is essentially independent of the input pulse shape. That is, as the negative-going input voltage step reduces emitter current in transistor 30, the emitter voltage drops to a level to forward-bias the base-emitter junction of transistor 54, which junction holds the emitter voltage at that level and supplies the reduced current from transistor 30. Accordingly, once the transistor 54 becomes forward-biased, it is driven deeply into saturation and tends to maintain the conditions for continuing in saturation. Transistor 30 does not ordinarily cut off due to the negative-going input step, but remains in the active state operating as an emitter-follower. However, where the base-emitter current requirement of transistor 54 should be unusually large (due to unpredictable variations in transistor parameters), the current drawn by transistor 54 as it saturates may be sufficient to cut off transistor 30.

The circuit does not depend on regenerative action to drive pulse former transistor 74 into saturation or to cut off. That is, as soon as transistor 54 starts to conduct, pulse former 74 is driven hard to conduction and saturation, and the leading edge of the output pulse is generated. The signal fed back via resistor 94 is merely for the purpose of maintaining the circuit in the active state until the time delay circuit has had sufficient time within which to operate. Moreover, the pulse-former is not turned off by regeneration; to the contrary, the pulse former 74 is fully cut off by the saturation current in transistor 78. The signal feedback at that time via resistor 94 operates to cut off transistor 54 so as to permit fast discharge of the capacitor 112 and cut off of transistor 78; that is, the operation after cut off of pulse former 74 is one of restoring the rest of the circuit to its quiescent state.

The feature of this pulse generator of direct driving of the pulse former transistor 74 between its active and inactive states independent of any regenerative path has been found to be extremely important in obtaining very fast rise and fall times of the generated rectangular pulses. That is, the triggering transistor 54, as it is switched to its active state, is effective to fully saturate pulse former transistor 74; this action takes place by way of a direct coupling path through diode 76, which path is independent of the time delay network that includes the reactive element 112, and does not depend on any regenerative action. Thus, there is no significant time delay introduced by a reactance that has to be charged or discharged, and the leading edge of the output pulse is extremely sharp. Similarly, turn-off transistor 78 is effective to change pulse former 74 to its inactive state by way of a direct path that is independent of any regenerative path and of the reactance element 112 of the time delay circuit and that is also independent of the triggering transistor 54. Accordingly, delay effects due to charging or discharging of the reactive element and due to any changes of state of the triggering transistor 54 are not involved in the generation of the trailing edge. Consequently, an extremely sharp trailing edge is also generated.

This invention may employ various types of active circuit elements; e.g. in place of transistors, vacuum tubes, tunnel diodes or any other appropriate device may be used. The timing circuitry for producing a controlled spacing between the leading and trailing edges of the output pulse may take forms other than the RC integrating and differentiating circuits shown in the embodiments of FIGS. 2, 4, and 5. Any appropriate energy storing device may be used; for instance, where tunnel diodes are used as the active elements, an inductor would be appropriate as the time delay element.

Accordingly, a new and improved pulse generator is provided. It is effective to generate rectangular pulses having a constant amplitude and fast rise and fall time periods and of different widths that may be varied over a wide range. The pulse generator may be used to produce very narrow pulses at extremely high repetition rates.

What is claimed is:

1. A pulse generator circuit comprising output terminal means, pulse former switch means having two operating states for supplying different constant signal levels to said output terminal means when in one and the other of said states, a time delay circuit, trigger means having an output directly connected to an input of said pulse former means and responsive to an input signal for directly driving said pulse former means to one of said states independently of said time delay circuit and for initiating operation of said time delay circuit, branch circuit means including said time delay circuit and switch means responsive to a voltage in said time delay circuit for directly driving said pulse former means to the other of said states independently of said trigger means, said branch circuit being connected between said trigger output and an input of said pulse former means, and means responsive to the signal level at said output terminal means for controlling said trigger means to maintain the state of said pulse former means in the absence of an input signal.

2. The combination of claim 1 wherein said time delay circuit includes a reactive network.

3. The combination of claim 2 wherein said reactive network is an RC integrating network.

4. The combination of claim 2 wherein said reactive network is an RC differentiating network.

5. The combination of claim 2 wherein said time delay circuit further includes a low impedance discharge path independent of said pulse former switch means.

6. The combination of claim 5 wherein said discharge path includes a device selectively operable to discharge said reactive network upon said pulse former means being driven to said other state.

7. A pulse generator comprising a plurality of semiconductive devices, each having base, emitter and collector electrodes, the emitter electrode of a first of said devices being connected to the base electrode of a second of said devices, the collector of said second device being coupled to the base electrodes of a third and a fourth of said devices, the collector electrode of said fourth device being connected to said base electrode of said third device, means coupling the collector of said third device to an output terminal and to the base of said first device, and the emitter of said third device being connected to a consant level voltage source, pulse means connected to the base of said first device for supplying signals thereto, said first device being responsive to said pulse means signals for saturating said second device, means including said second device for driving said third device to saturation upon said second device being saturated, thereby generating at the collector of said third device the leading edge of a pulse, means including said third device for supplying said constant level to said output terminal upon said third device being saturated, means including said second device for saturating said fourth device a desired period after saturation of said third device, means including said fourth device when saturated to cut off said third device and thereby generate the trailing edge of said pulse at its collector.

8. A pulse generator comprising a plurality of semiconductive devices each having base, emitter and collector electrodes, the base electrode of a first of said devices being coupled to a pulse source, the base electrode of a second of said devices being connected to the emitter electrode of said first device, means including said first device for saturating said second device whenever said first device receives a certain pulse, the collector electrode of said second device being connected to the base electrode of a third of said devices via a diode, means including said second device for saturating said third device to generate the leading edge of an output pulse at its collector electrode upon saturation of said second device, the emitter of said third device being connected to a clamping voltage source whereby a constant amplitude voltage output is supplied at the collector electrode thereof when said third device is saturated, the collector electrode of said second device being further coupled to the base electrode of a fourth of said devices via a reactive network, means including said reactive network for preventing saturation of said fourth device upon saturation of said second device and until after a desired time period has elapsed, means connecting the collector electrode of said fourth device to the base electrode of said third device to cut off said third device upon saturation of said fourth device, whereby the trailing edge of said output pulse is generated upon said third device being cut off.

9. The combination of claim 8 and further comprising means including said diode to decouple said third device from said second device upon saturation of said third device.

10. The combination of claim 8 wherein said collector electrode of said third device is connected to the base electrode of said first device via a directly coupled circuit so that said second device remains saturated until said third device is cut off.

11. The combination of claim 10 and further comprising means for connecting a low impedance path between said reactive network and said second device whereby said reactive network is enabled to discharge quickly after said second device is cut off.

12. A pulse generator circuit comprising output terminal means, pulse former switch means having two operating states for supplying different constant signal levels to said output terminal means when in one and the other of said states, switch means having an output directly connected to an input of said pulse former means and responsive to an input signal for directly driving said pulse former means to one of said states, branch circuit means including an integrating circuit and means responsive to the voltage developed in said integrating circuit after a certain time period for directly driving said pulse former switch means to the other of said states, said branch circuit means being connected between said switch means output and said pulse former input to receive a voltage to be integrated from said switch means output, and holding circuit means coupling an output of said pulse former means to an input of said switch means for maintaining said pulse former means in said one state during said time period.

13. A pulse generator circuit as recited in claim 12 wherein said integrating circuit includes a capacitor and a variable resistor for charging said capacitor.

14. A pulse generator circuit as recited in claim 13 wherein said capacitor is variable, and said voltage responsive means includes additional switch means responsive to the voltage across said capacitor.

15. A pulse generator circuit as recited in claim 12 and further comprising means for decoupling the input of said pulse former means from said switch means output after said pulse former means is driven to said one state.

16. A pulse generator circuit comprising a source of a plurality of constant signal levels, an output terminal means, pulse former switch means having two operating states and connected to said source and output terminal means for supplying one and another of said levels to said output terminal means when in one and the other of said states, respectively, circuit means including a voltage ramp and time delay circuit and switch means responsive to the voltage developed in said ramp circuit for directly driving said pulse former means from said one state fully to said other state, and additional switch means having an output directly connected to the input of said pulse former switch means and responsive to an input signal for directly driving said pulse former switch means from said other state fully to said one state and for initiating operation of said time delay circuit, said voltage ramp circuit being connected to be energized by the voltage at the output of said additional switch means.

17. A pulse generator circuit as recited in claim 16 wherein said voltage ramp circuit includes a variable resistor and variable capacitor in series relation, and said switch means is responsive to the voltage across said capacitor.

References Cited

UNITED STATES PATENTS

| | | | |
|---|---|---|---|
| 2,770,732 | 11/1956 | Chong | 307—88.5 |
| 3,065,362 | 11/1962 | Benson | 307—88.5 |
| 3,231,765 | 1/1966 | Martin et al. | 307—88.5 |

ARTHUR GAUSS, *Primary Examiner.*

D. D. FORRER, *Assistant Examiner.*